US011516396B2

(12) United States Patent
Appel et al.

(10) Patent No.: US 11,516,396 B2
(45) Date of Patent: Nov. 29, 2022

(54) ROUTING OF TRANSMISSION MEDIA THROUGH ROTATABLE COMPONENTS

(71) Applicant: GoPro, Inc., San Mateo, CA (US)

(72) Inventors: Austin Appel, Foster City, CA (US); Himay Shukla, San Mateo, CA (US); Kielan C. Crow, San Mateo, CA (US); Hong Zuo, Oakland, CA (US)

(73) Assignee: GoPro, Inc., San Mateo, CA (US)

( * ) Notice: Subject to any disclaimer, the term of this patent is extended or adjusted under 35 U.S.C. 154(b) by 264 days.

(21) Appl. No.: 16/571,992

(22) Filed: Sep. 16, 2019

(65) Prior Publication Data
US 2020/0036878 A1 Jan. 30, 2020

Related U.S. Application Data

(63) Continuation of application No. 16/288,432, filed on Feb. 28, 2019, now Pat. No. 10,432,863, which is a
(Continued)

(51) Int. Cl.
H04N 5/232 (2006.01)
H04N 7/10 (2006.01)
(Continued)

(52) U.S. Cl.
CPC ........... *H04N 5/2328* (2013.01); *F16M 11/10* (2013.01); *F16M 11/2071* (2013.01); *H04N 7/10* (2013.01);
(Continued)

(58) Field of Classification Search
CPC ...... H04N 5/2328; H04N 7/10; H04N 5/2353; H04N 7/013; H04N 19/137;
(Continued)

(56) References Cited

U.S. PATENT DOCUMENTS 10,432,863 B2 * 10/2019 Appel ................. H05K 5/0247
2003/0060927 A1 3/2003 Gerbi
(Continued)

FOREIGN PATENT DOCUMENTS

CN 205560201 U 9/2016
CN 106849453 A 6/2017
(Continued)

OTHER PUBLICATIONS

International Search Report and Written Opinion for Application No. PCT/US2019/012046, dated Apr. 25, 2019, 8 pages.

*Primary Examiner* — Lin Ye
*Assistant Examiner* — Tuan H Le
(74) *Attorney, Agent, or Firm* — Young Basile Hanlon & MacFarlane, P.C.

(57) ABSTRACT

In one aspect of the present disclosure, a gimbal assembly is described for use with an image capturing device. The gimbal assembly includes a motor assembly, a first housing defining an internal compartment that is configured and dimensioned to receive the motor assembly, and a second housing that is mechanically connected to the motor assembly such that actuation of the motor assembly causes relative rotation between the first and second housings. The first housing includes a first guide that is configured and dimensioned to support transmission media adapted to communicate electrical and/or digital signals. The second housing defines a channel that is configured and dimensioned to receive the first guide such that the first guide extends into the second housing through the channel. The transmission media is supported on the first guide such that the first guide routes the transmission media from the first housing into the second housing.

20 Claims, 11 Drawing Sheets

Related U.S. Application Data continuation of application No. 15/973,827, filed on May 8, 2018, now Pat. No. 10,462,369.

(60) Provisional application No. 62/614,143, filed on Jan. 5, 2018.

(51) Int. Cl.

| | |
|---|---|
| *F16M 11/10* | (2006.01) |
| *F16M 11/20* | (2006.01) |
| *H05K 5/02* | (2006.01) |
| *H05K 5/00* | (2006.01) |
| *B64D 47/08* | (2006.01) |
| *F16M 13/02* | (2006.01) |
| *F16M 13/04* | (2006.01) |
| *B64C 39/02* | (2006.01) |

(52) U.S. Cl.
CPC ......... *H05K 5/0004* (2013.01); *H05K 5/0247* (2013.01); *B64C 39/024* (2013.01); *B64C 2201/127* (2013.01); *B64D 47/08* (2013.01); *F16M 13/02* (2013.01); *F16M 13/04* (2013.01)

(58) Field of Classification Search
CPC ........... H04N 5/23241; H04N 5/23245; H04N 5/341; H04N 5/3745; F16M 11/10; F16M 11/2071; F16M 13/02; F16M 13/04; F16M 2200/045; F16M 2200/044; F16M 13/022; F16M 2200/041; F16M 13/00; F16M 11/123; F16M 11/18; H05K 5/0247; H05K 5/0004; B64D 47/08; B64C 39/024; B64C 2201/127; G06T 7/20

See application file for complete search history.

(56) References Cited

U.S. PATENT DOCUMENTS

| | | |
|---|---|---|
| 2006/0071121 A1 | 4/2006 | Wescott |
| 2007/0050139 A1 | 3/2007 | Sidman |
| 2010/0278523 A1 | 11/2010 | Brown |
| 2012/0008900 A1 | 1/2012 | Schneider |
| 2014/0270743 A1 | 9/2014 | Webb |
| 2015/0077630 A1 | 3/2015 | Miller |
| 2016/0016674 A1 | 1/2016 | Zhao |
| 2016/0195798 A1 | 7/2016 | Nenov |
| 2016/0248962 A1 | 8/2016 | Li |
| 2016/0252799 A1 | 9/2016 | Li |
| 2016/0286111 A1 | 9/2016 | Suwa |
| 2016/0337492 A1 | 11/2016 | Tseng |
| 2017/0090141 A1* | 3/2017 | Chin ................. G01S 7/003 |
| 2017/0094185 A1 | 3/2017 | Wang |
| 2017/0099416 A1* | 4/2017 | Pan .................... F16M 13/04 |
| 2017/0176840 A1 | 6/2017 | Zhou |
| 2017/0198747 A1 | 7/2017 | Chen |
| 2017/0227831 A1 | 8/2017 | Tang |
| 2017/0302852 A1 | 10/2017 | Lam |
| 2017/0321664 A1 | 11/2017 | Robbins |
| 2017/0336019 A1* | 11/2017 | Liu .................... H05K 1/0281 |
| 2017/0338639 A1 | 11/2017 | Liu |
| 2017/0366652 A1 | 12/2017 | Boerckel |
| 2018/0284579 A1* | 10/2018 | Yan .................... F16M 11/10 |
| 2018/0301802 A1 | 10/2018 | Elford |
| 2019/0235358 A1* | 8/2019 | Huang ............... F16M 11/2064 |

FOREIGN PATENT DOCUMENTS

| | | |
|---|---|---|
| CN | 106870891 A | 6/2017 |
| WO | 2016190994 A1 | 12/2016 |
| WO | 2017213339 A1 | 12/2017 |

\* cited by examiner

ROUTING OF TRANSMISSION MEDIA THROUGH ROTATABLE COMPONENTS

CROSS REFERENCE TO RELATED APPLICATION(S)

This application is a continuation of U.S. patent application Ser. No. 16/288,432, filed Feb. 28, 2019, which is a continuation of U.S. patent application Ser. No. 15/973,827, filed May 8, 2018, which claims the benefit of U.S. Provisional Application No. 62/614,143, filed Jan. 5, 2018, the disclosures of which are hereby incorporated by reference in their entirety.

TECHNICAL FIELD

The present disclosure generally relates to the routing of data and power transmission media, such as flexible printed circuits (FPCs), coaxial cables, wiring, and the like, through rotatable components, such as gimbal assemblies, used in connection with digital image capturing devices (DICDs).

BACKGROUND

Unstabilized images and videos are often unusable or unwatchable given the distortion resulting from undesirable movement of the DICD during image/video capture. To combat this issue, rotatable gimbal assemblies are often used in the context of action photography, or in connection with a vehicle such as a drone or an automobile, to support DICDs to provide stability and offset movement that would otherwise distort captured images and/or video.

The transmission media used in DICDs to transmit power and electrical signals is often delicate and can be easily compromised, such as by exposure to external radio frequency signals, or subject to physical damage. While various structures and methods have been developed to route transmission media internally in an effort to address these concerns, inherent complexities remain when routing transmission media through rotatable components, such as the aforementioned gimbal assemblies. For example, excessively long FPCs and wiring can increase the complexity of assembly, and can create issues with rubbing, friction, and/or inductance, while shorter FPCs and wiring can result in reduced signal integrity and may inhibit power and signal transmission.

As such, there remains a need for improvement in the structures and methods used to route transmission media internally through rotatable components.

SUMMARY

In one aspect of the present disclosure, a gimbal assembly is described for use with an image capturing device. The gimbal assembly includes a motor assembly, a first housing defining an internal compartment that is configured and dimensioned to receive the motor assembly, and a second housing that is mechanically connected to the motor assembly, such as through the use of one or more mechanical fasteners, whereby actuation of the motor assembly causes relative rotation of the housings about an axis of rotation. For example, it is envisioned that the first housing may be rotated in relation to the second housing, that the second housing may be rotated in relation to the first housing, or that the first and second housings may be rotated relative to each other.

The first housing includes a first guide that is configured and dimensioned to support transmission media adapted to communicate electrical and/or digital signals, and the second housing defines a channel that is configured and dimensioned to receive the first guide such that the first guide extends into the second housing through the channel. The first guide supports the transmission media so as to redirect and route the transmission media from the first housing into the second housing.

Each of the first and second housings includes an arm that extends outwardly therefrom. At least one of the arms of the first and second housings is configured and dimensioned to directly or indirectly support the image capturing device. For example, in certain embodiments of the disclosure, systems are described that include multiple gimbal assemblies, for example, a first gimbal assembly, a second gimbal assembly, and a third gimbal assembly. In such systems, the first gimbal assembly may be configured and dimensioned to support the second gimbal assembly, the second gimbal assembly may be configured and dimensioned to support the third gimbal assembly, and the third gimbal assembly may be configured and dimensioned to directly support the image capturing device. The first and second gimbal assemblies would thus indirectly support the image capturing device by virtue of their support of the third gimbal assembly.

In certain embodiments, the channel may be arcuate in configuration.

In certain embodiments, the second housing may be movable through a range of motion defined by the channel.

In certain embodiments, the channel may terminate at a first end to define a first stop that is configured and dimensioned for contact with the first guide, and the channel may terminate at a second end to define a second stop that is configured and dimensioned for contact with the first guide.

In certain embodiments, the second housing may be movable between a first position, wherein the first guide is in contact with the first stop, and a second position, wherein the first guide is in contact with the second stop.

In certain embodiments, the first guide may be oriented such that the first guide extends in generally parallel relation to the axis of rotation.

In certain embodiments, the first guide may include a base portion and a support extending from the base portion. In such embodiments, the base portion may extend along a first axis, and the support may extend along a second axis that intersects the first axis so as to subtend an angle therebetween. The first guide is configured and dimensioned such that the angle subtended by the first and second axes is sufficient to redirect and route the transmission media so as to extend from the first guide across the second housing and into the arm of the second housing. Routing of the transmission media in this manner allows for extension of the transmission media across the second housing in an uncoiled configuration, thereby allowing for a reduction in the overall length of the transmission media.

In certain embodiments, the first guide may be configured and dimensioned such that the angle subtended by the first and second axes lies substantially within the range of approximately 45° to approximately 135°. For example, the first guide may be configured and dimensioned such that the angle subtended by the first and second axes is approximately 90°.

In certain embodiments, the transmission media may be secured to the first guide, such as by an adhesive. For example, the transmission media may be secured to the base portion and/or the support.

In certain embodiments, the arm of the second housing may include a mounting structure. In such embodiments, the transmission media may be secured to the mounting structure, such as by an adhesive, so as to create sufficient slack in the transmission media to permit relative rotation of the first and second housings.

In certain embodiments, the second housing may further include at least one additional guide that is positioned between the first guide and the arm of the second housing.

In certain embodiments, the at least one additional guide may include a second guide and a third guide.

In certain embodiments, the second guide and the third guide may be configured as discrete structures.

In certain embodiments, the second guide and the third guide may define a passage therebetween that is configured and dimensioned to receive the transmission media.

In certain embodiments, the second guide and the third guide may include an arcuate configuration.

In another aspect of the present disclosure, a gimbal assembly is described for use with an image capturing device. The gimbal assembly includes a motor assembly having a motor and a motor shaft that extends from the motor, as well as a first housing defining an internal compartment that is configured and dimensioned to receive the motor assembly, and a second housing that is mechanically connected to the motor assembly such that actuation of the motor assembly causes relative rotation of the housings about an axis of rotation.

The motor shaft defines an internal passage that is configured and dimensioned to receive transmission media adapted to communicate electrical and/or digital signals.

Each of the first and second housings includes an arm that extends outwardly therefrom. At least one of the arms of the first and second housings is configured and dimensioned to directly or indirectly support the image capturing device.

In certain embodiments, the transmission media may include a first transmission media and a second, different transmission media. For example, the first transmission media may include a generally planar or flat configuration, and the second transmission media may include a generally circular or rounded cross-sectional configuration. In such embodiments, each of the first and second transmission media may extend through the internal passage of the motor shaft.

In certain embodiments, the first transmission media may be configured as a flexible printed circuit, and the second transmission media may be configured as wiring.

In certain embodiments, the gimbal assembly may further include a clip that is configured and dimensioned for contact with the transmission media to guide/route the transmission media within the second housing. In such embodiments, the second housing may include a clip mount that is configured and dimensioned for engagement with the clip to secure the clip to the second housing.

In certain embodiments, when used with a first transmission media and a second, different transmission media, the clip may be configured and dimensioned such that the first transmission media coils about the clip as the second housing rotates in a first direction and uncoils as the second housing rotates in a second direction opposite the first direction.

In certain embodiments, the clip may include an arcuate outer wall that provides a surface about which the first transmission media can be coiled as the second housing rotates in the first direction.

In certain embodiments, the clip may be generally cordiform in configuration.

In certain embodiments, the clip may include an extension that projects inwardly into an interior region of the clip.

In certain embodiments, the extension may define an engagement region that is configured and dimensioned to receive the clip mount to secure the clip to the clip mount.

In certain embodiments, the clip may further include a guide that is configured and dimensioned to receive the second transmission media.

In certain embodiments, the guide may be configured and dimensioned to receive and route the second transmission media through the second housing in an uncoiled configuration.

In certain embodiments, the guide may be positioned on the extension.

In certain embodiments, the clip may further include an inner wall. In such embodiments, the guide may extend from the inner wall.

In certain embodiments, the guide may define a receptacle that is configured and dimensioned to receive the second transmission media. For example, the receptacle may be configured and dimensioned to receive the second transmission media in snap-fit relation.

In certain embodiments, the second housing may further include a retainer that is configured and dimensioned to support the second transmission media. In such embodiments, the retainer may be positioned to guide/route the second transmission media from the clip to the arm of the second housing.

In another aspect of the present disclosure, a gimbal assembly is described that is configured and dimensioned to route first and second transmission media internally to facilitate use of the gimbal assembly with an image capturing device. The gimbal assembly includes a motor assembly having a motor and a motor shaft that extends from the motor, as well as a first housing defining an internal compartment that is configured and dimensioned to receive the motor assembly, and a second housing that is mechanically connected to the motor assembly such that actuation of the motor assembly causes relative rotation of the housings about an axis of rotation.

The motor shaft defines an internal passage that is configured and dimensioned to receive the first transmission media such that the first transmission media can be routed through the gimbal assembly in an uncoiled configuration.

Each of the first and second housings includes an arm that extends outwardly therefrom. At least one of the arms of the first and second housings is configured and dimensioned to directly or indirectly support the image capturing device.

The second housing includes a clip that is configured and dimensioned such that the second transmission media coils about the clip as the second housing rotates in a first direction and uncoils as the second housing rotates in a second direction opposite the first direction.

In certain embodiments, the clip includes an arcuate outer wall that provides a surface about which the first transmission media can be coiled as the second housing rotates in the first direction.

In certain embodiments, the clip may further include a guide that is configured and dimensioned to receive the second transmission media.

In certain embodiments, the guide may define a receptacle that is configured and dimensioned to receive the second transmission media.

In another aspect of the present disclosure, a gimbal assembly is described for use with an image capturing device. The gimbal assembly includes a motor assembly, a first housing defining an internal compartment that is configured and dimensioned to receive the motor assembly, and a second housing that is mechanically connected to the motor assembly such that actuation of the motor assembly causes relative rotation between the first and second housings about an axis of rotation.

The first housing includes an arm extending outwardly therefrom, and a first guide that is configured and dimensioned to support transmission media adapted to communicate electrical and/or digital signals.

The second housing includes an arm extending outwardly therefrom, wherein at least one of the arms of the first and second housings is configured and dimensioned to directly or indirectly support the image capturing device. The second housing defines a channel that is configured and dimensioned to receive the first guide such that the first guide extends into the second housing through the channel. The transmission media is supported on the first guide such that the first guide routes the transmission media from the first housing into the second housing.

In certain embodiments, the first and second housings may be relatively movable through a range of motion defined by the channel.

In certain embodiments, the channel may terminate at first and second ends. In such embodiments, the first end may define a first stop configured and dimensioned for contact with the first guide, and the second end may define a second stop configured and dimensioned for contact with the first guide.

In certain embodiments, the first and second housings may be repositionable between a first position, wherein the first guide is in contact with the first stop, and a second position, wherein the first guide is in contact with the second stop. In such embodiments, the range of relative motion between the first and second housings may be defined between the first and second positions.

In certain embodiments, the first guide may be oriented in generally parallel relation to the axis of rotation.

In certain embodiments, the first guide may include a base portion and a support extending from the base portion, wherein the base portion extends along a first axis and the support extends along a second axis that intersects the first axis so as to subtend an angle therebetween. In such embodiments, the angle may be sufficient to route the transmission media through the gimbal assembly such that the transmission media extends from the first guide, across the second housing, and into the arm of the second housing in an uncoiled configuration.

In certain embodiments, the first guide may be configured and dimensioned such that the angle subtended between the first and second axes lies substantially within the range of approximately 45° to approximately 135°.

In certain embodiments, the transmission media may be secured to the first guide. For example, the transmission media may be secured to the base portion and the support.

In certain embodiments, the arm of the second housing may include a mounting structure. In such embodiments, the transmission media may be secured to the mounting structure so as to create sufficient slack in the transmission media to permit relative rotation between the first and second housings.

In certain embodiments, the second housing may further include at least one additional guide that is positioned between the first guide and the arm of the second housing.

In certain embodiments, the at least one additional guide may include a second guide and a third guide.

In certain embodiments, the second guide and the third guide may be configured as discrete structures.

In certain embodiments, the second guide and the third guide may define a passage therebetween that is configured and dimensioned to receive the transmission media.

In certain embodiments, the second guide and the third guide may each include an arcuate configuration.

In another aspect of the present disclosure, a gimbal assembly is described for use with an image capturing device. The gimbal assembly includes a first housing having a first arm and a first guide that is configured and dimensioned to support transmission media adapted to communicate electrical and/or digital signals, a motor assembly that is positioned within the first housing, and a second housing that is mechanically connected to the motor assembly to facilitate relative rotation between the first and second housings. The second housing includes a second arm, wherein at least one of the first and second arms is configured and dimensioned to support the image capturing device, a channel that is configured and dimensioned to receive the first guide such that the transmission media is routed from the first housing into the second housing, and a second guide defining a passage that is configured and dimensioned to receive the transmission media to route the transmission media across the second housing such that the transmission media extends into the second arm in an uncoiled configuration.

In certain embodiments, the channel terminates at opposing ends that are configured and dimensioned for contact with the first guide so as to define a range of relative rotational motion between the first and second housings.

In certain embodiments, the second guide may include a pair of discrete braces, wherein the passage extends between the braces.

In certain embodiments, the braces may each include an arcuate configuration defining a curvature that is dimensioned to support the transmission media in the uncoiled configuration during relative rotation between the first and second housings.

In another aspect of the present disclosure, a method is described for routing electrical and/or digital transmission media through a rotatable gimbal assembly for use with an image capturing device in an uncoiled configuration. The method includes: (i) securing the transmission media to a first guide such that the transmission media extends from a first housing of the gimbal assembly towards a second housing of the gimbal assembly, wherein the first and second housings are mechanically connected to permit relative rotation therebetween; (ii) routing the transmission media into the second housing through a channel formed in the second housing; and (iii) routing the transmission media across the second housing in the uncoiled configuration via a second guide so as to create sufficient slack in the transmission media to permit relative rotation between the first and second housings. The second guide includes an arcuate configuration defining a curvature that is dimensioned to support the transmission media in the uncoiled configuration during relative rotation between the first and second housings.

DETAILED DESCRIPTION

The present disclosure relates to the routing of data and power transmission media, such as FPCs, coaxial cable, wiring, and the like, through rotatable gimbal assemblies used in connection with DICDs. Throughout the present disclosure, the term "transmission media" should be understood to include any medium suitable for transmitting power and/or digital data, such as digital images and/or digital video. Additionally, the term "FPC" should be understood to include microflex, high-resolution video cable (e.g., 4k), and the term "wiring" should be understood to include electrical wiring, coaxial cable, etc. Moreover, when used in the context of transmission media, the term "coiled" should be understood as referring to a configuration in which the transmission media is concentrically wound about itself. In contrast, the term "uncoiled" should be understood as referring to and including any configuration in which the transmission media is not concentrically wound about itself, such as, for example, configurations in which the transmission media extends either in a generally linear manner or a generally non-linear manner, for example, bent, wavy, sinusoidal, etc.

The gimbal systems and assemblies disclosed herein allow for various types of transmission media to pass across and through the interior of the assemblies in a manner that allows for free rotation. As the assemblies rotate, internal guides and structures support and route the transmission media and allow the transmission media to rotate, deflect, and bend in a controlled manner. Throughout the present disclosure, when used as verbs, terms such as "direct," "guide," and "route" may be used interchangeably. The various embodiments of the gimbal assemblies disclosed herein permit both coiled and uncoiled routing of transmission media internally through the gimbal assemblies to allow for capitalization on any advantages, and a reduction in any disadvantages, of coiled and uncoiled routing.

Figure 1:
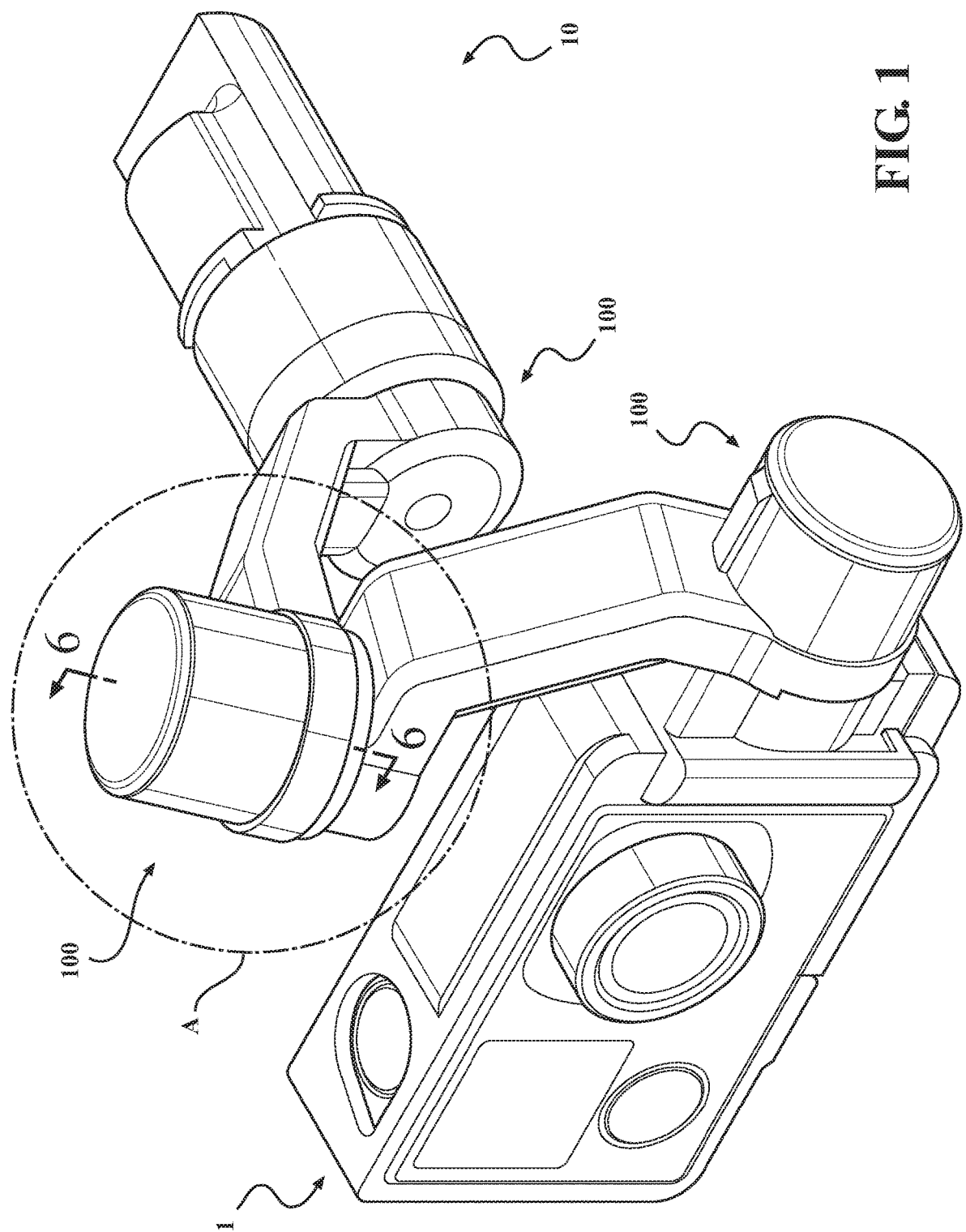
FIG. 1 is a side, perspective view of an exemplary DICD together with a gimbal system including a plurality of individual gimbal assemblies in accordance with the principles of the present disclosure.
Figure 2:
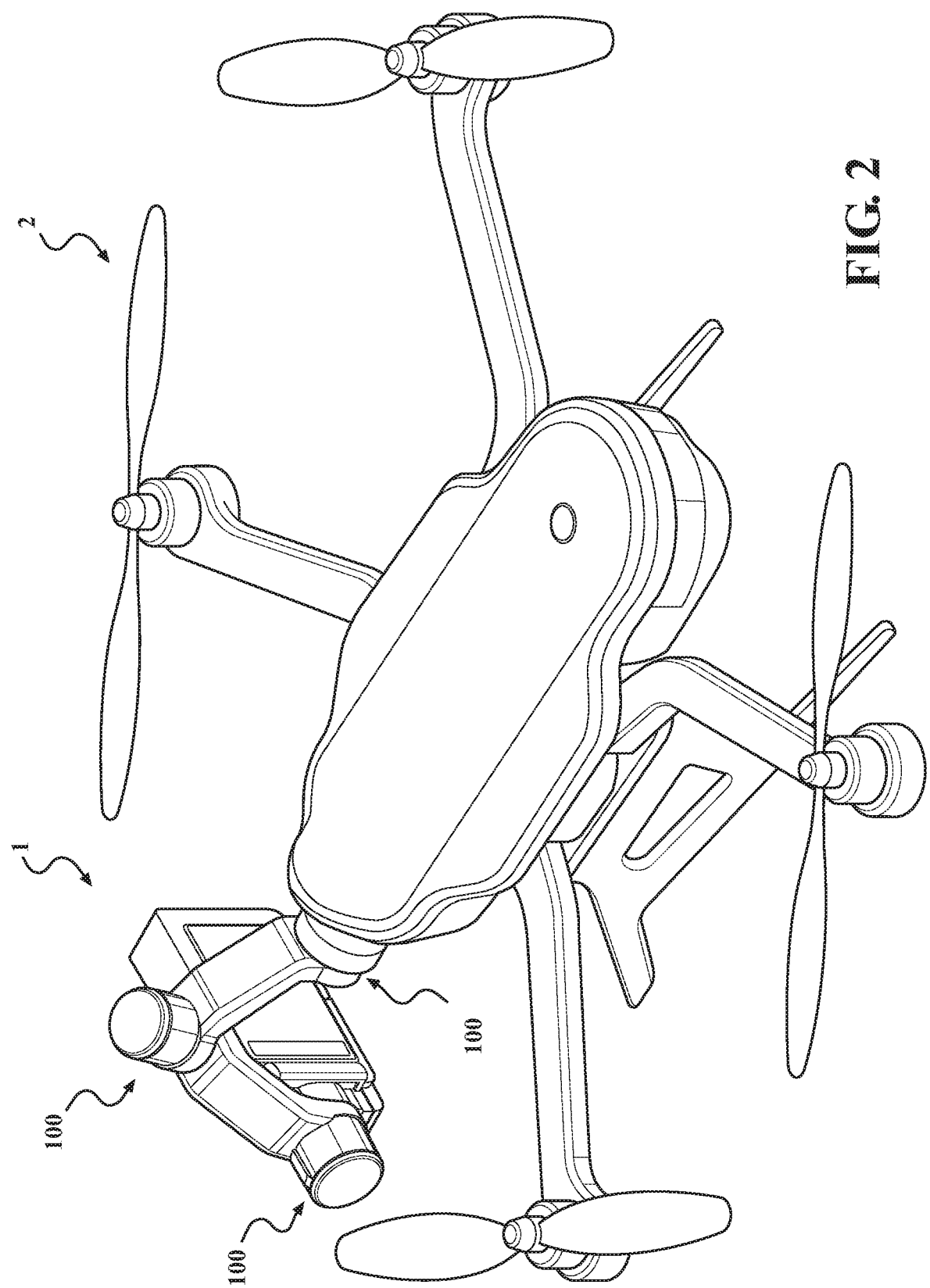
FIG. 2 is a top, perspective view illustrating use of the DICD and the gimbal system shown in FIG. 1 with an exemplary unmanned aerial vehicle.
Figure 3:
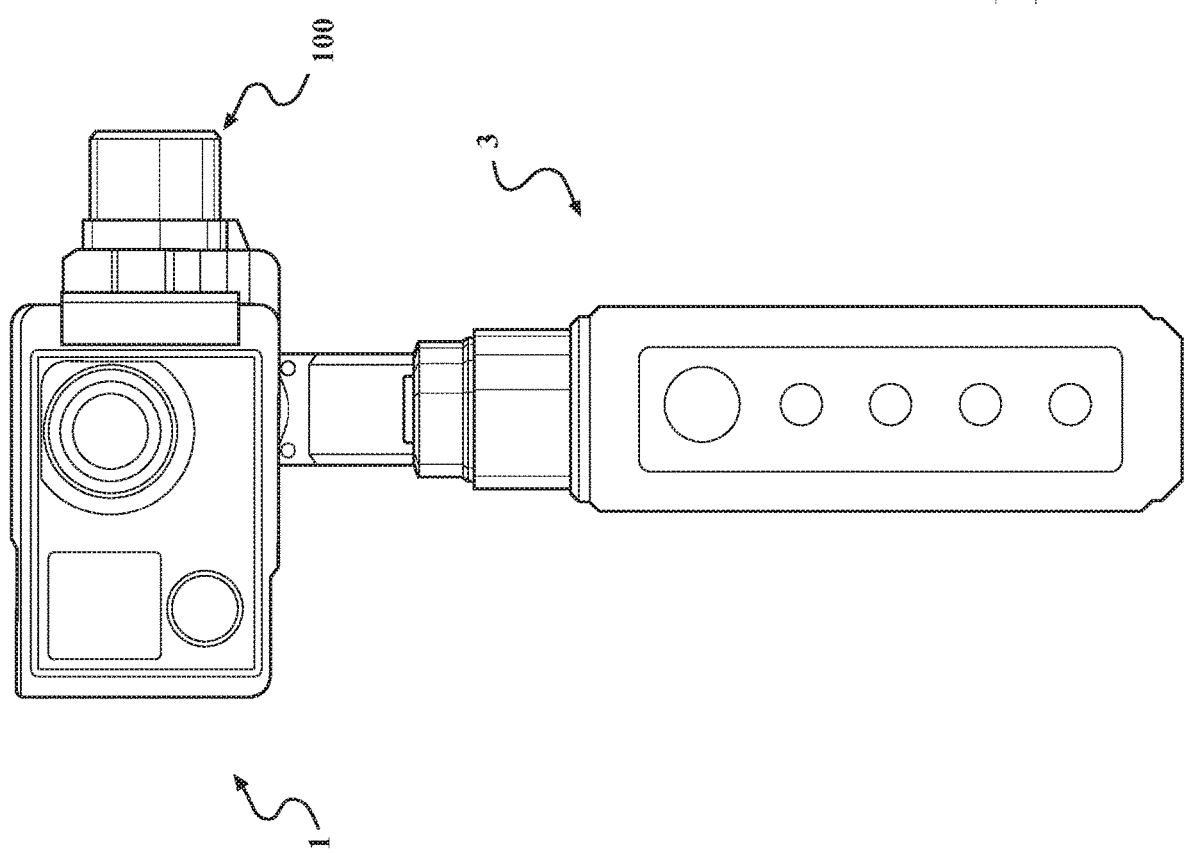
FIG. 3 is a front view illustrating use of the DICD and the gimbal system shown in FIG. 1 with an exemplary hand-held apparatus.

Gimbal systems and assemblies according to the present disclosure may find applicability in a wide variety of applications. For example, FIG. 1 illustrates a gimbal system 10 including a plurality of individual gimbal assemblies 100 according to the principles of the present disclosure for use in stabilizing one or more DICDs 1 during image/video capture. The gimbal system 10 and the individual gimbal assemblies 100 are configured, dimensioned, and positioned to offset movement that might otherwise compromise the quality of the captured image/video, and may be incorporated into vehicles, such as an unmanned aerial vehicle 2, as seen in FIG. 2, a bicycle, an automobile, etc. The gimbal system 10 and the gimbal assemblies 100 may also be incorporated into a hand-held apparatus 3, as illustrated in FIG. 3; into a wearable support (not shown), such as a vest, glove, helmet, hat, etc.; or into any other application in which it may be advantageous to stabilize a DICD during the capture of image/video data.

With reference now to FIGS. 1 and 4-6, an embodiment of the presently disclosed gimbal assembly 100 will be discussed. The gimbal assembly 100 includes a motor assembly 200 (FIG. 4), a first (lower) housing 300 that is configured and dimensioned to accommodate the motor assembly 200, and a second (upper) housing 400.

Figure 4:
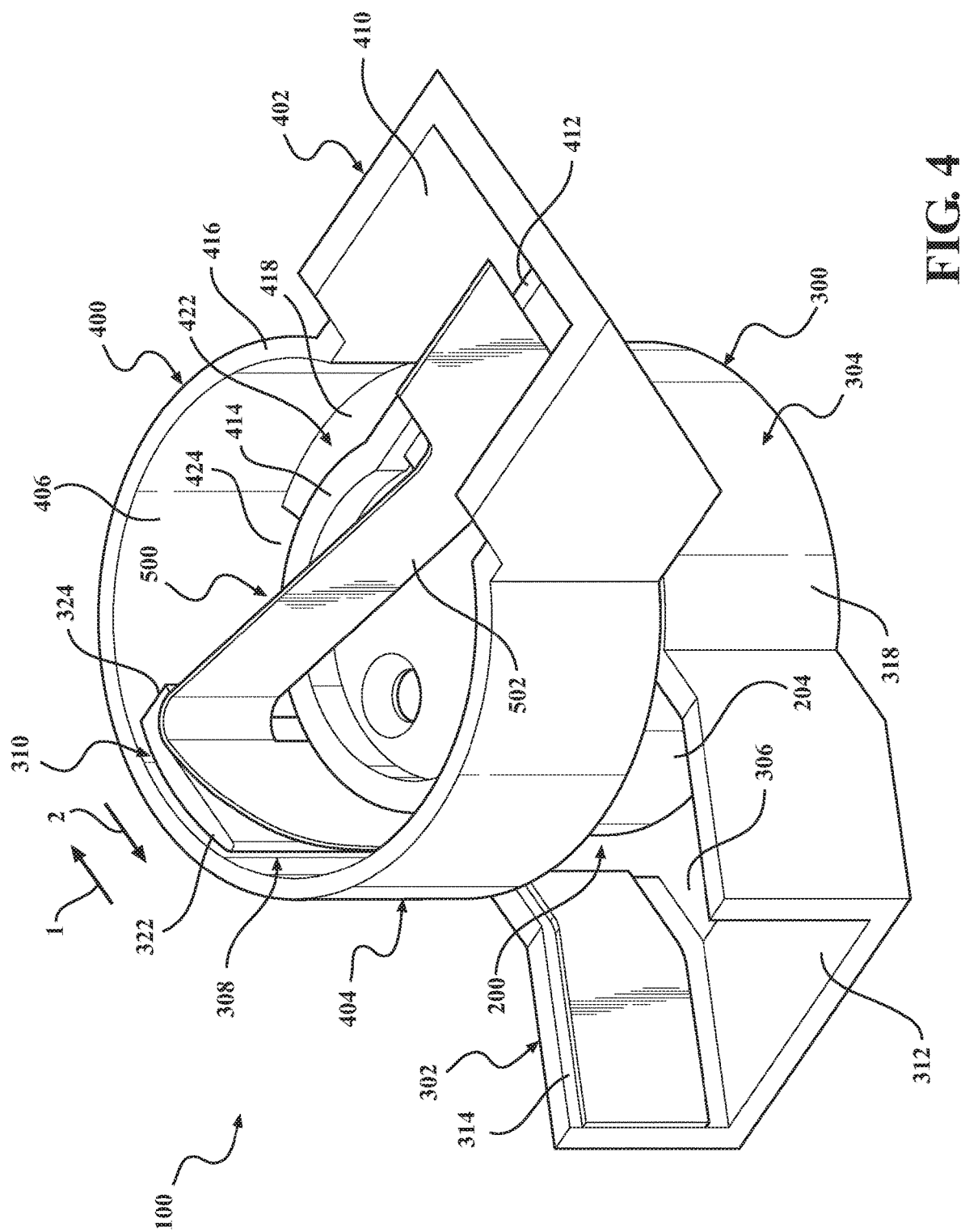
FIGS. 4 and 5 are partial top, perspective views of one of the gimbal assemblies according to the present disclosure in the area of detail "A" indicated in FIG. 1.
Figure 5:
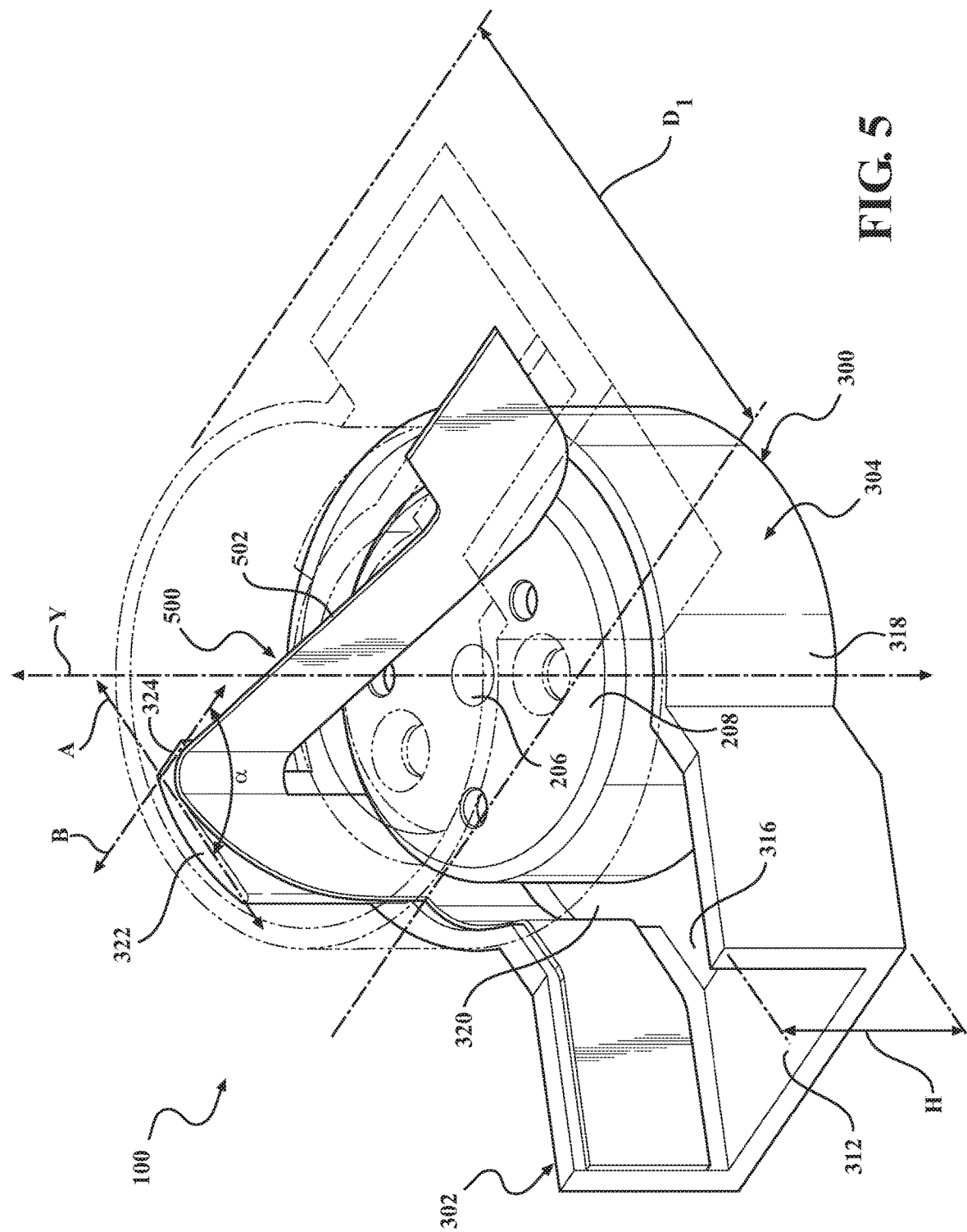
Figure 6:
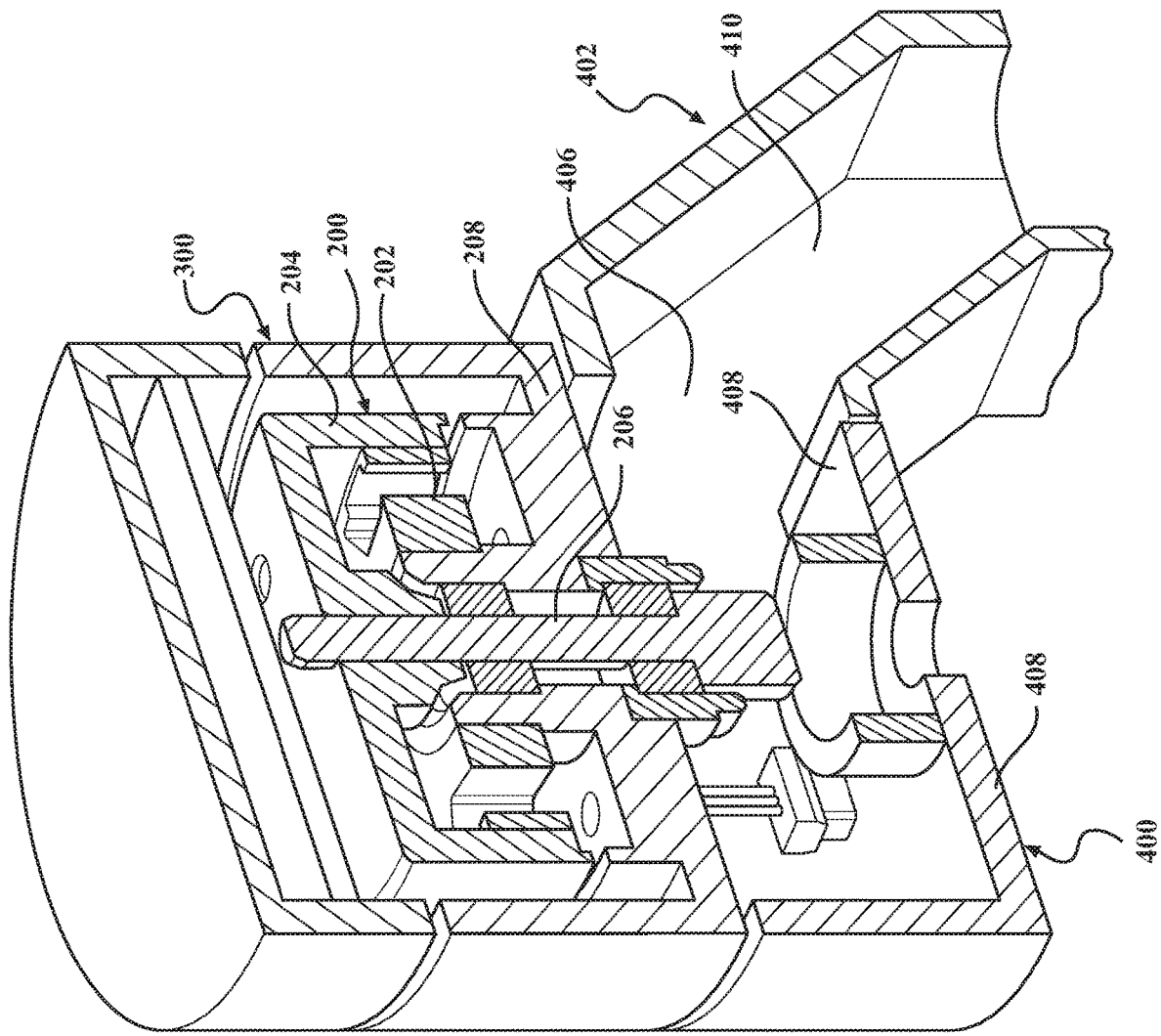
FIG. 6 is a partial longitudinal, cross-sectional view of one of the gimbal assemblies according to the present disclosure taken along line 6-6 in FIG. 1.

The motor assembly 200 includes a motor 202, a motor housing 204 (FIGS. 4, 6) that accommodates the motor 202, a motor shaft 206 (FIGS. 5, 6) that extends outwardly from the motor 202, and a motor cap 208 (FIGS. 5, 6). The motor 202 may be any mechanism capable of causing relative rotation between the housings 300, 400 in a manner suitable for the intended purpose of stabilizing a DICD, for example, the DICD 1 seen in FIG. 1, in the manner discussed above. For example, in one embodiment, the motor (not shown) may be configured as a servo motor. In the particular embodiment illustrated in FIGS. 1 and 4-6, the gimbal assembly 100 is configured and dimensioned such that actuation of the motor assembly 200 causes rotation of the second housing 400 in relation to the first housing 300 about an axis of rotation Y (FIG. 5). In alternate embodiments, however, it is envisioned that the first housing 300 may be rotated in relation to the second housing 400, or that the respective first and second housings 300, 400 may be rotated in relation to each other.

The housings 300, 400 accommodate the internal components of the gimbal assembly 100, discussed in further detail below, as well as one or more varieties of transmission media 500, which facilitate, for example, data transfer, power transfer, and/or the communication of control signals to the gimbal assembly 100. In the particular embodiment shown in FIGS. 1 and 4-6, the housings 300, 400 are shown as being generally cylindrical in configuration and may each define a transverse cross-sectional dimension $D_1$ (FIG. 5), for example, a diameter, substantially within the range of approximately 20 mm to 30 mm, and a height H substantially within the range of approximately 10 mm to 15 mm. In alternate embodiments of the disclosure, however, it is envisioned that the geometrical configurations of the housings 300, 400 and/or the dimensions of the housings 300, 400 may be varied.

Depending upon the intended use and positioning of the gimbal assembly 100, the housings 300, 400 may be oriented vertically (i.e., in upper and lower relation), as illustrated in FIGS. 4-6, horizontally (i.e., in side-by-side relation), or at any orientation in-between. The gimbal assembly 100, and the various components thereof, may be formed from any suitable materials or combinations of materials. For example, it is envisioned that the gimbal assembly 100 may be intended for underwater use, and, thus, may include water-resistant or waterproof materials. In some implementations, it is envisioned that the gimbal assembly 100 may be intended for use in situations that could result in collision, ballistic impact, etc., and, thus, may include impact-resistant materials, such as metallic materials, carbon fiber, etc.

As seen in FIGS. 4 and 5, the housing 300 includes an arm 302, a body 304 defining an internal compartment 306, and a guide 308, which is configured as a bracket 310 in the illustrated embodiment. It is envisioned that the housing 300 may be formed through any suitable method of manufacture, such as, for example, through injection molding. As such, it is envisioned that the body 304 and the arm 302 may be integrally formed, as seen in FIGS. 4 and 5, or, alternatively, that the arm 302 and the housing 300 may be formed as separate, discrete structures.

The arm 302 extends radially outward from the body 304, and defines an internal passage 312 that is configured and dimensioned to receive the transmission media 500, which may include one or more FPCs 502 (FIG. 5) and/or wiring (not shown). For example, a first FPC 502 may be used to power the DICD 1 (FIG. 1), and a second, separate FPC 502 may be used to power the motor assembly 200. It is envisioned that the transmission media 500 may be secured to an inner surface 314 (FIG. 4) of the arm 302, such as, for example, through the use of an adhesive and/or a mechanical fastener, for example, a clip, screw, rivet, or the like. The precise location of the arm 302 in relation to the body 304 may be varied during manufacture depending upon, for example, the intended use and/or position of the gimbal assembly 100, for example, in relation to the DICD 1 (FIG. 1).

The body 304 of the housing 300 includes a floor 316 (FIG. 5) and an upstanding wall 318. The floor 316 and the wall 318 cooperate to define the internal compartment 306 (FIG. 4) that receives the motor assembly 200. The internal compartment 306 is dimensioned to provide a clearance 320 (FIG. 5) between the motor assembly 200 and the wall 318 of the housing 300 for receipt of the transmission media 500. For example, in one embodiment, it is envisioned that the clearance 320 may lie substantially within the range of 1 mm to 25 mm or more.

The guide 308 extends vertically from the body 304 to direct and route the transmission media 500 from the housing 300 into the housing 400. In one embodiment, such as that illustrated in FIG. 5, for example, it is envisioned that the guide 308 may extend in generally parallel relation to the axis of rotation Y. To maintain proper positioning of the transmission media 500, it is envisioned that the transmission media 500 may be secured to the guide 308, such as, for example, through the use of an adhesive and/or a mechanical fastener, for example, a clip, screw, rivet, or the like.

In the illustrated embodiment, the bracket 310 is shown as being integrally formed with the body 304 of the housing 300, via injection molding, for example, such that the guide 308 extends upwardly from the floor 316 and radially inward from the wall 318. In alternate embodiments, however, it is envisioned that the body 304 and the guide 308 may be discrete structures, and/or that the guide 308 may be spaced inwardly from the wall 318 to create radial separation between the guide 308 and the wall 318.

In the particular embodiment seen in FIGS. 4 and 5, the guide 308 includes a base portion 322 and a support 324 that depends radially inward from the base portion 322. In certain embodiments, it is envisioned that the base portion 322 and the support 324 may be integrally formed, for example, via injection molding. It should be appreciated, however, that various constructions or methods of manufac-turing the bracket 310 may be employed in alternate embodiments without departing from the scope of the present disclosure.

The base portion 322 extends transversely (i.e., in relation to the vertical height of the base portion 322) in a first direction along a first axis A-A (FIG. 5), and the support 324 extends transversely (i.e., in relation to the vertical height of the support 324) in a second direction along a second axis B-B that intersects the first axis A-A. The axes A-A, B-B subtend an angle α sufficient to redirect and route the transmission media 500 through the gimbal assembly 100 from the arm 302 vertically into the housing 400 and across the housing 400 in an uncoiled configuration, as will be discussed in further detail below. To facilitate redirection and guidance of the transmission media 500 in the intended fashion, it is envisioned that the transmission media 500 may be secured to the base portion 322 and/or the support 324, such as through the use of an adhesive and/or one or more mechanical fasteners, for example, clips.

Although the base portion 322 and the support 324 are illustrated as being in generally orthogonal relation in the embodiment of the guide 308 seen in FIGS. 4 and 5 (i.e., such that the angle α is approximately 90°, it should be appreciated that the configuration of the guide 308 may be varied in alternate embodiments to achieve any suitable value for the angle α. For example, in certain embodiments, it is envisioned that the angle α may lie substantially within the range of approximately 45° to approximately 135°.

With reference to FIGS. 4-6, the housing 400 includes an arm 402, a body 404 defining an internal compartment 406, and a removable cap 408 (FIG. 6) that is configured and dimensioned for connection to the body 404 to close the internal compartment 406. As discussed above in connection with the housing 300, it is envisioned that the housing 400 may be formed through any suitable method of manufacture, such as, for example, through injection molding. It is further envisioned that the arm 402 and the body 404 may be integrally formed, as seen in FIGS. 4-6, or, alternatively, that the arm 402 and the housing 400 may be formed as separate, discrete structures.

The arm 402 extends radially outward from the body 404, and defines an internal passage 410 (FIGS. 4, 6) that is configured and dimensioned to receive the transmission media 500 (FIGS. 4, 5). The arm 402 further includes a mounting structure 412 (FIG. 4), such as a tab, flange, or the like, to which the transmission media 500 can be secured, for example, using an adhesive and/or one or more mechanical fasteners. The precise location of the arm 402 in relation to the body 404 may be varied during manufacture depending upon, for example, the intended use and/or position of the gimbal assembly 100, for example, in relation to the DICD 1 (FIG. 1).

The body 404 of the housing 400 includes a floor 414 (FIG. 4), an upstanding wall 416, and a bridge member 418 that connects the floor 414 to the upstanding wall 416. In the embodiment illustrated in FIGS. 4-6, the body 404 is configured and dimensioned for engagement with the motor assembly 200 (FIGS. 4, 6) such that actuation of the motor assembly 200 causes rotation of the housing 400 in relation to the housing 300. It is envisioned that the motor assembly 200 may be received by a seat (not shown) formed in a bottom surface of the body 404. In some implementations, it is envisioned that the housing 400 may be secured to the motor assembly 200, for example, to the motor cap 208 (FIGS. 5, 6), through the use of one or more fasteners 420 (FIG. 7), such as screws, rivets, or the like, and/or through the use of an adhesive.

As seen in FIG. 4, for example, the bridge member 418 connects the floor 414 to the upstanding wall 416 at an attachment region 422 that partially circumscribes the floor 414 so as to define a channel 424 that shares common ends with the bridge member 418. The channel 424 is configured and dimensioned to receive the guide 308 such that the guide 308 extends into the internal compartment 406 of the housing 400 through the channel 424, and extends between opposing ends of the bridge member 418 and the channel 424.

Upon actuation of the motor assembly 200 (FIGS. 4, 6), the guide 308 traverses the channel 424 as the gimbal assembly 100 moves through its range of motion. More specifically, in the embodiment illustrated in FIGS. 4-6, the housing 400 rotates in relation to the housing 300 between a starting position, in which the guide 308 is in contact with one end of the bridge member 418, and an ending position, in which the guide 308 is in contact with the opposite end of the bridge member 418. The ends of the channel 424 and the bridge member 418 thus define stops that are configured and dimensioned for contact with the guide 308 to restrict continued motion of the housing 400 in relation to the housing 300. It is envisioned that the channel 424, and, thus, the range of motion of the gimbal assembly 100, may span 180°-360°. However, by adjusting the dimensions of the bridge member 418 and/or the guide 308 in alternate embodiments, the range of motion for the gimbal assembly 100 can be varied.

With reference again to FIGS. 1 and 4-6, use of the gimbal assembly will be discussed. During use of the DICD 1 (FIG. 1), as movement of the DICD 1 is detected by one or more sensors (not shown), the motor assembly 200 is actuated to offset the movement detected by the sensors and thereby stabilize the DICD 1. Upon actuation, the motor 202 is rotated to cause relative rotation between the housings 300, 400. For example, in the context of the embodiment seen in FIGS. 4-6, as the motor 202 rotates in the direction indicated by arrow 1 (FIG. 4), the housing 400 is caused to rotate such that the guide 308 traverses the channel 424 in the opposite direction indicated by arrow 2. Oppositely, as the motor 202 rotates in the direction indicated by arrow 2, the housing 400 is caused to rotate such that the guide 308 traverses the channel 424 in the direction indicated by arrow 1.

As the guide 308 traverses the channel 424, the transmission media 500 (FIG. 5) is permitted to "wave" or vacillate as slack is added to and removed from the transmission media 500, for example, to permit relative rotation between the housings 300, 400. In certain embodiments, it is envisioned that the gimbal assembly 100 may be configured, dimensioned, and assembled such that all slack is removed from the transmission media 500 when the guide 308 is positioned diametrically opposite the mounting structure 412 (FIG. 4) included on the arm 402 of the housing 400 such that the transmission media 500 extends in a generally linear fashion from the guide 308 to the mounting structure 412, as seen in FIG. 4. As the guide 308 deviates from the position seen in FIG. 4 and approaches the bridge member 418, slack is returned to the transmission media 500. As slack is returned to the transmission media 500, it is envisioned that the transmission media 500 may bend, bow, or otherwise deflect within the internal compartment 406 (FIGS. 4, 6) defined by the housing 400.

The configuration, dimensions, and positions of the components of the gimbal assembly 100, such as the guide 308 (FIG. 4) and the mounting structure 412, allow for the elimination of coiling in the transmission media 500. By eliminating coiling, the overall length of the transmission media 500 can be reduced, which may provide advantages in certain applications. For example, in the context of an FPC, such as the FPC 502 (FIG. 5), as the length of the FPC approaches an upper limit, the ability to carry a high-quality signal is reduced. Reducing the overall length of the FPC thus has the effect of facilitating higher resolution data transmission. Moreover, eliminating coiling within the gimbal assembly 100 eliminates stresses on the transmission media 500 that might otherwise result from rubbing or friction created during rotation of the gimbal assembly 100 and corresponding expansion and contraction of the coil, as well as potential inductance issues. Coil elimination also reduces complexity in assembly, and permits the use of various transmission media 500 that may not have sufficient structural rigidity to maintain a coiled configuration. By removing coiling from the transmission media 500, the natural tendency to uncoil, and the resulting biasing force, can also be removed, which may reduce strain on the motor assembly 200, and may permit use with an increased variety of transmission media 500.

Figure 7:
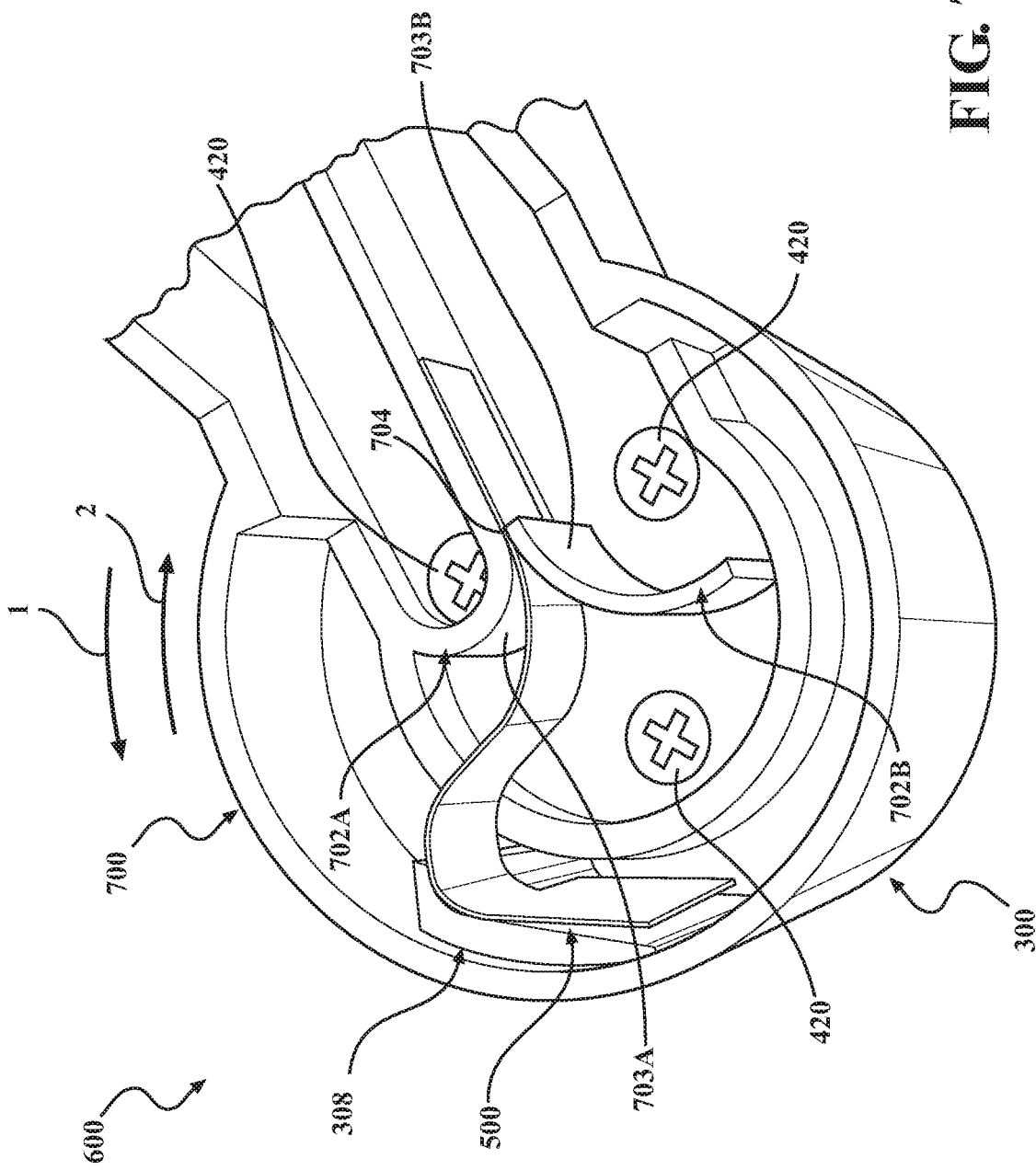
FIG. 7 is a partial top, perspective view of another embodiment of the presently disclosed gimbal assembly including a plurality of internal guides to route transmission media internally within the gimbal assembly.

With reference now to FIG. 7, an alternate embodiment of the gimbal assembly (identified by the reference character 600) will be discussed. The gimbal assembly 600 is substantially similar to the gimbal assembly 100 discussed above with respect to FIGS. 1 and 4-6, for example, and, accordingly, in the interest of brevity, will only be discussed with respect to any differences therefrom.

The gimbal assembly 600 includes a second (upper) housing 700 with an arm 702, and one or more additional guides $702_A$, $702_B$ that cooperate with the guide 308 extending from the first (lower) housing 300 to further assist in routing the transmission media 500 through the gimbal assembly 600. Although shown as including a pair of guides $702_A$, $702_B$ configured as discrete braces $703_A$, $703_B$, in alternate embodiments, the specific number, location, and/or configurations of the guides $702_A$, $702_B$ may be altered or varied without departing from the scope of the present disclosure. For example, it is envisioned that the gimbal assembly 600 may include a single guide only, such as the guide $702_A$.

The guides $702_A$, $702_B$ are oriented such that the transmission media 500 extends between the guides $702_A$, $702_B$ as the transmission media 500 traverses the housing 700. More specifically, the guides $702_A$, $702_B$ define a passage 704 therebetween that is configured and dimensioned to receive the transmission media 500. The guides $702_A$, $702_B$ thus permit routing of the transmission media 500 across the housing 700 into the arm 702 in an uncoiled configuration, as discussed above in connection with the gimbal assembly 100 (FIGS. 4-6).

In the illustrated embodiment, each of the guides $702_A$, $702_B$ includes an arcuate configuration defining a curvature that is dimensioned to support the transmission media 500 during relative rotation between the housings 300, 700, and restrain displacement of the transmission media 500 via receipt within the passage 704. The arcuate configurations of the guides $702_A$, $702_B$ facilitate bending or other such deformation in a predetermined, controlled manner. By restraining the transmission media 500 and controlling the manner and extent to which the transmission media 500 bends, the likelihood of kinking, twisting, or other such undesirable deformation can be reduced, thereby potentially increasing the usable life of the transmission media 500. In the specific embodiment illustrated in FIG. 7, for example, as the housing 700 rotates in the direction indicated by arrow 1, the guide $702_B$ supports the transmission media 500 such that the transmission media 500 bends along the contour defined by the guide $702_B$. Likewise, as the housing 700 rotates in the direction indicated by arrow 2, the guide $702_A$ supports the transmission media 500 such that the transmission media 500 bends along the contour defined by the guide $702_A$.

In alternate embodiments, it is envisioned that the specific configurations, dimensions, and/or positions of the guides $702_A$, $702_B$ may be varied. For example, depending upon the type of transmission media 500 (e.g., FPC, coaxial cable, and/or wiring), as well as the brand, model, thickness, and/or intended use of the transmission media 500, the size and/or curvature of the guides $702_A$, $702_B$ may be varied to adjust the bend radius realized by the transmission media 500 during relative rotation between the housings 300, 700.

Figure 8:
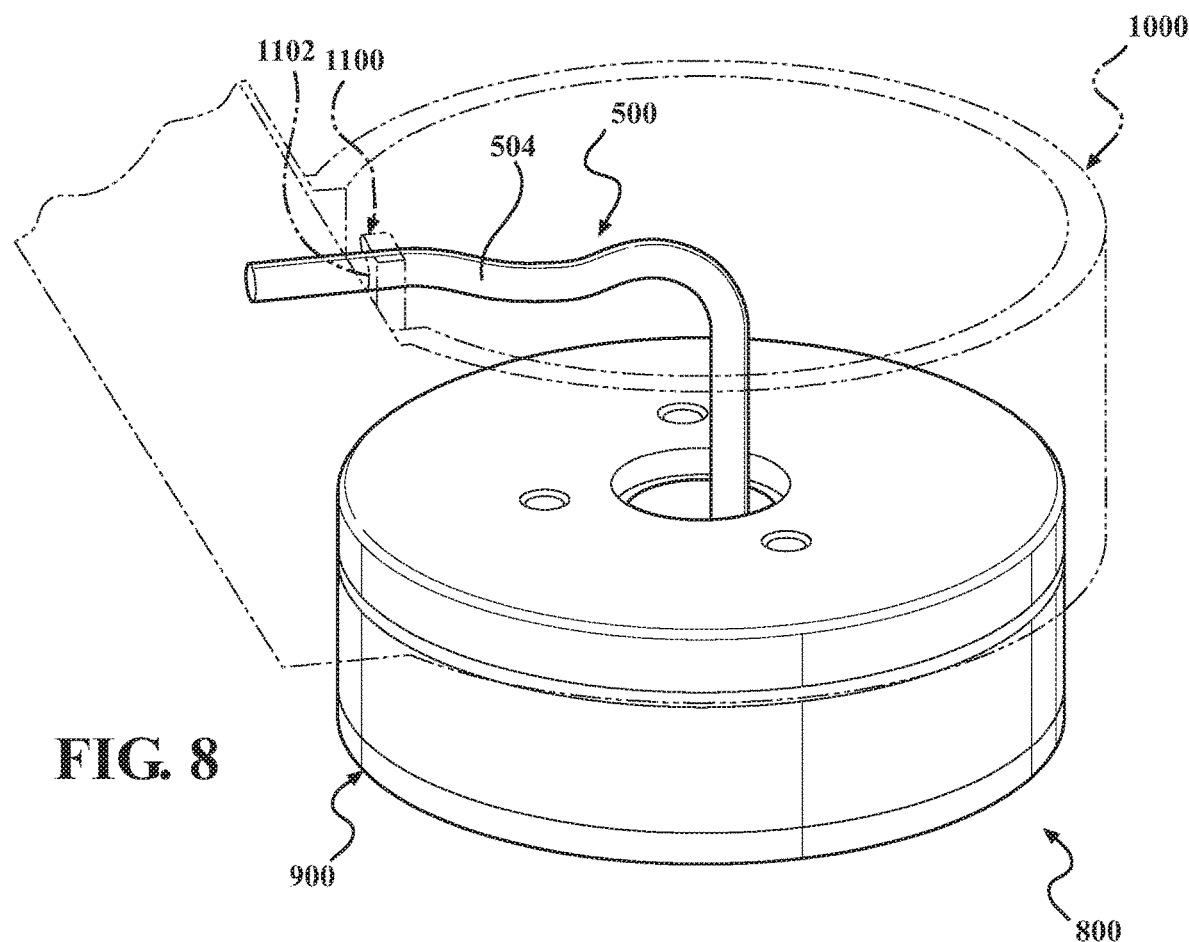
FIG. 8 is a partial top, perspective view of another embodiment of the presently disclosed gimbal assembly including a hollow motor shaft.
Figure 9:
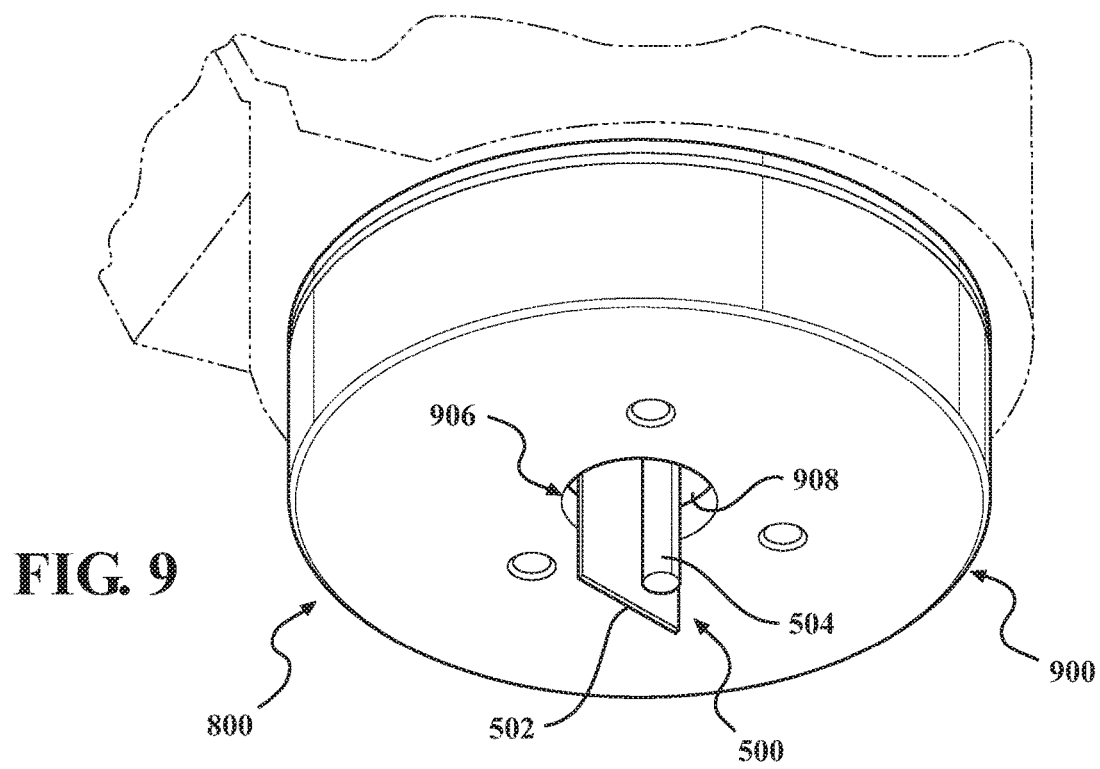
FIG. 9 is a partial bottom, perspective view of the gimbal assembly seen in FIG. 8.

With reference now to FIGS. 8 and 9, an alternate embodiment of the gimbal assembly (identified by the reference character 800) will be discussed. The gimbal assembly 800 is substantially similar to the gimbal assembly 100 discussed above with respect to FIGS. 4-6, for example, and, accordingly, in the interest of brevity, will only be discussed with respect to any differences therefrom.

The gimbal assembly 800 includes a motor assembly 900 having a hollow motor shaft 906 (FIG. 9) defining an internal passage 908 that is configured and dimensioned to receive the transmission media 500, and a second (upper) housing 1000. As illustrated in FIG. 9, in various embodiments, the transmission media 500 may include the aforementioned FPC 502 and/or wiring 504, either individually (FIG. 8) or in combination (FIG. 9). By routing the transmission media 500 through the passage 908 extending through the motor shaft 906, coiling in the transmission media 500 can be eliminated. Moreover, it is envisioned that routing of the transmission media 500 through the motor shaft 906 may allow for further reductions in the overall length of the transmission media 500, thus potentially facilitating even higher resolution data transmission.

To further support the transmission media 500, the housing 1000 may include a retainer 1100 (FIG. 8) that is configured and dimensioned to receive or otherwise contact the transmission media 500 such that the transmission media 500 rotates concurrently with the housing 1000 during use of the gimbal assembly 800. For example, the retainer 1100 may include an opening 1102 (e.g., a slot, aperture, or the like) that is configured and dimensioned to receive or otherwise engage the transmission media 500. In alternate embodiments, it is envisioned that the retainer 1100 may be either integrally formed with the housing 1000, via injection molding, for example, or that the housing 1000 and the retainer 1100 may be formed as separate, discrete components. For example, the retainer 1100 may be formed separately and connected to the housing 1000, such as by a mechanical fastener, clip, and/or or through the use of an adhesive.

During use of the gimbal assembly 800, relative rotation between the upper housing 1000 and the lower housing (not shown) causes corresponding rotational displacement of the transmission media 500 within the housing 1000 via engagement with the retainer 1100. As the transmission media 500 is displaced within the housing 1000, the transmission media 500 is allowed to rotate within the internal passage 908 (FIG. 9) defined by the motor shaft 906, and the motor shaft 906 rotates coaxially about the portions of the transmission media 500 extending therethrough.

Figure 10:
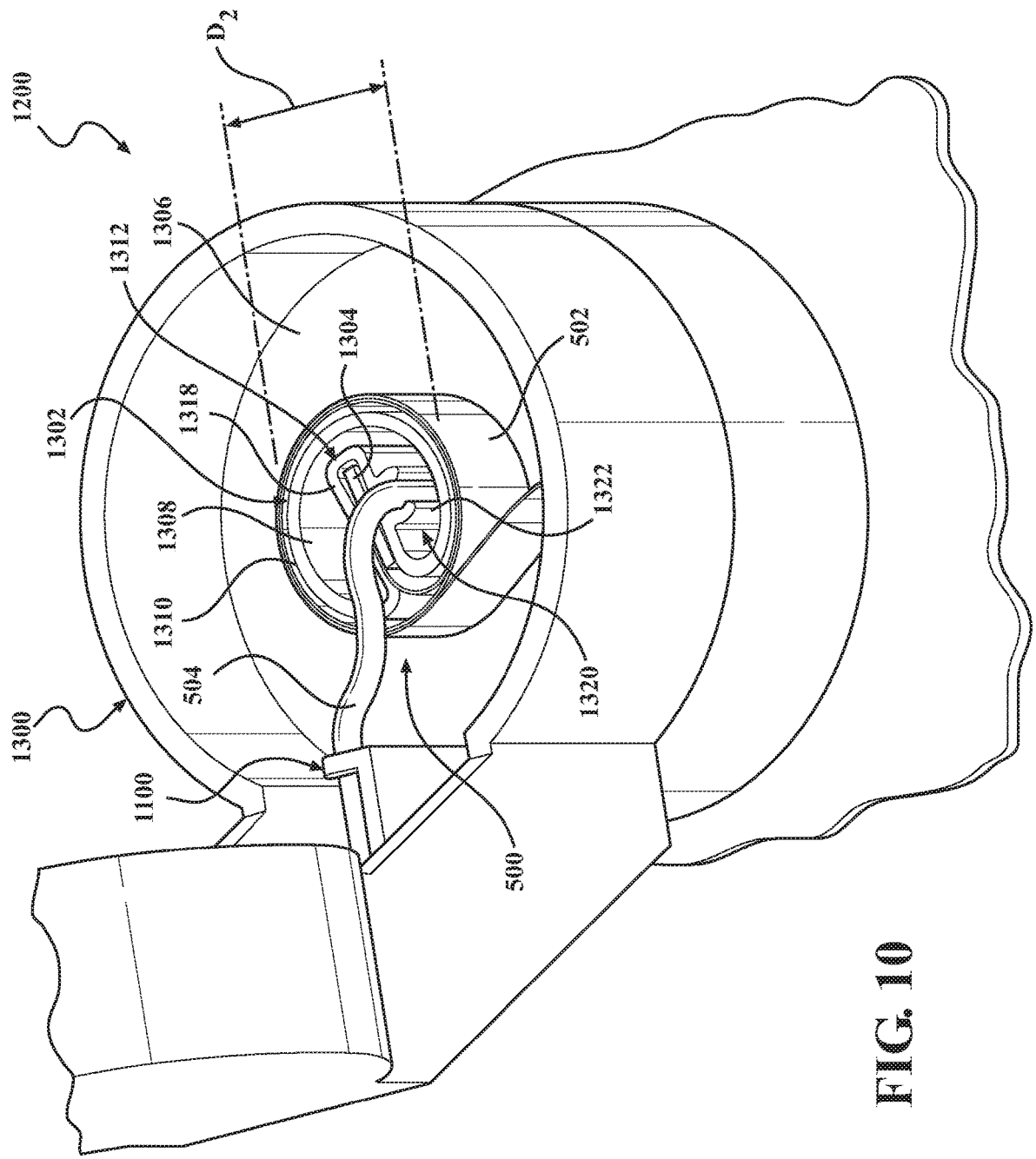
FIGS. 10 and 11 are partial top, perspective views of another embodiment of the presently disclosed gimbal assembly including a clip to route transmission media internally within the gimbal assembly.
Figure 11:
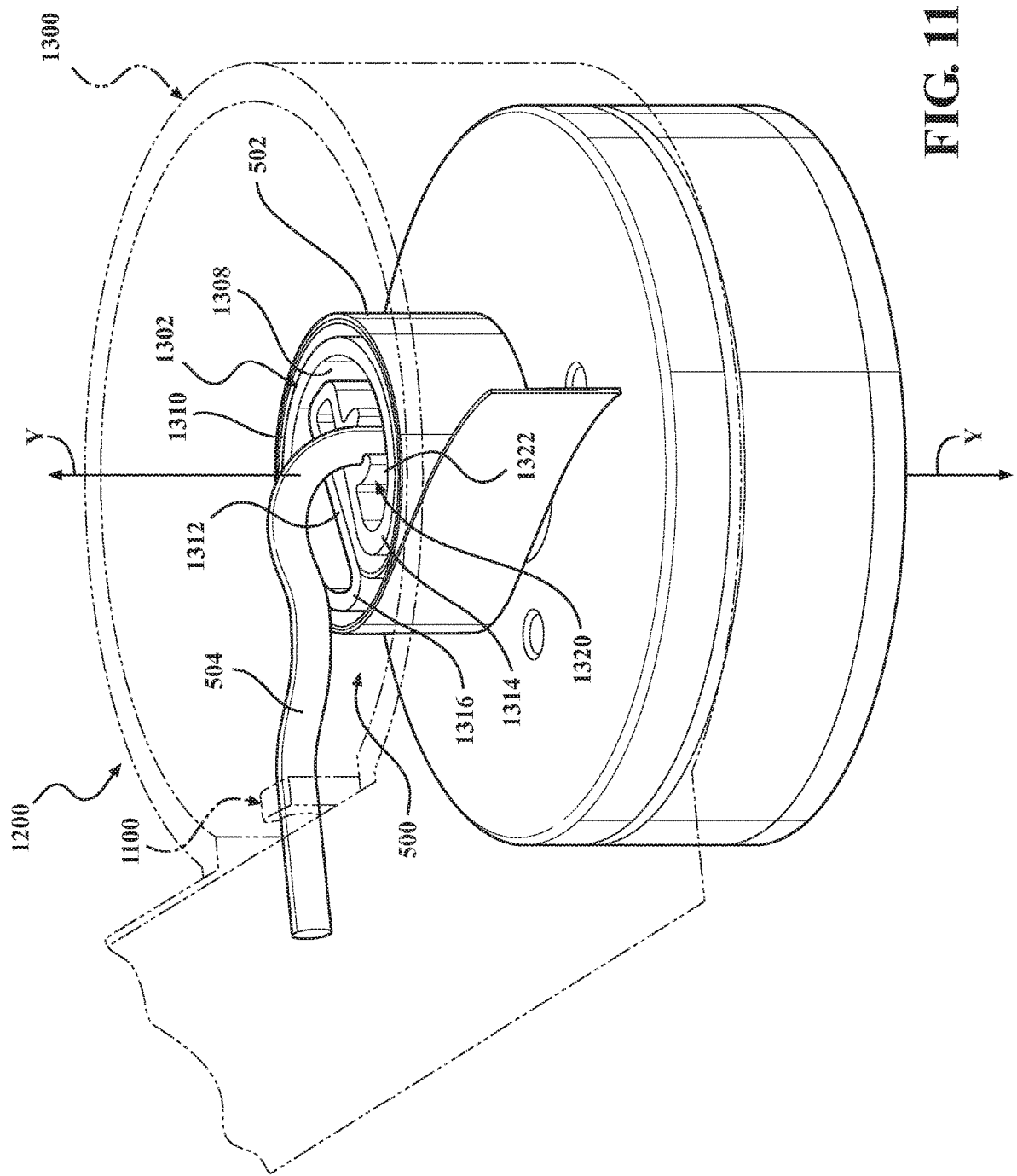

FIGS. 10 and 11 illustrate another embodiment of the presently disclosed gimbal assembly, which is identified by the reference character 1200. The gimbal assembly 1200 is substantially similar to the gimbal assembly 800 discussed above with respect to FIGS. 8 and 9, and, accordingly, in the interest of brevity, will only be discussed with respect to any differences therefrom.

The gimbal assembly 1200 includes a second (upper) housing 1300 with a clip 1302 and a clip mount 1304 that extends upwardly from a floor 1306 of the housing 1300. The clip 1302 is engageable with the clip mount 1304, and is configured and dimensioned to support the transmission media 500, which is shown as including both the aforementioned FPC 502 and wiring 504 in the illustrated embodiment. The clip 1302 may be formed from any suitable material, such as, for example, plastics, polymers, or the like. In alternate embodiments, it is envisioned that the housing 1300, the clip 1302, and/or the clip mount 1304 may be integrally formed, via injection molding, for example, or that the housing 1300, the clip 1302, and/or the clip mount 1304 may be formed as separate, discrete components. In the embodiment illustrated in FIGS. 10 and 11, for example, the clip 1302 is configured and dimensioned for removable engagement with the clip mount 1304 such that the clip 1302 can be removed from the clip mount 1304 when necessary or desirable, for example, for repair or replacement.

The clip 1302 is generally cordiform in configuration, and includes respective inner and outer walls 1308, 1310 (FIG. 10). The outer wall 1310 is arcuate in configuration and provides a surface about which the transmission media 500, for example, the FPC 502, may be coiled. In various embodiments, the particular dimensions of the clip 1302, such as a transverse dimension $D_2$ (FIG. 10) thereof, for example, the diameter of the clip 1302, may be altered to vary coiling of the transmission media 500. By increasing the transverse dimension $D_2$ defined by the clip 1302, a looser coil may be achieved, for example, when used in connection with more rigid transmission media 500. In contrast, by reducing the transverse dimension $D_2$ defined by the clip 1302, a tighter coil may be achieved, which may be more appropriate for less rigid forms of transmission media 500.

The clip 1302 includes an extension 1312 that projects inwardly into an interior region of the clip 1302 so as to define a pair of opposing lobes 1314, 1316 (FIG. 11) positioned on opposite sides of the extension 1312. The extension 1312 further defines an engagement region 1318 (FIG. 10) that receives the clip mount 1304 to secure the clip 1302 to the clip mount 1304. It is envisioned that the clip 1302 may receive the clip mount 1304 in a friction-fit, as shown in FIGS. 10 and 11. In some implementations, it is envisioned that the clip 1302 may be secured to the clip mount 1304 via mechanical fasteners, such as screws, rivets, or the like, and/or through the use of an adhesive.

In certain embodiments, such as that illustrated in FIGS. 10 and 11, the clip 1302 may further include a guide 1320 that is configured and dimensioned to receive the transmission media 500, for example, the wiring 504, after the entering the housing 1300 through the motor shaft 906 (FIG. 9). In the particular embodiment illustrated in FIGS. 10 and 11, for example, the guide 1320 is illustrated as extending outwardly from the extension 1312 so as to define a receptacle 1322. More particularly, in the illustrated embodiment, the guide 1320 extends outwardly from the inner wall 1308, that is, away from the axis of rotation Y (FIG. 11). As illustrated, the receptacle 1322 includes an arcuate configuration corresponding to that defined by the wiring 504 to facilitate receipt of the wiring 504 by the guide 1320. For example, it is envisioned that the guide 1320 may be configured and dimensioned to receive the wiring 504 in snap-fit relation to reduce relative movement between the clip 1302 and the wiring 504 at the location where the clip 1302 receives the wiring 504.

In some embodiments of the disclosure, it is envisioned that the clip 1302 may be devoid of the guide 1320. In such embodiments, it is envisioned that the transmission media 500, for example, the wiring 504, may simply extend into the housing 1300 through one of the lobes 1314, 1316 (FIG. 11) in an unrestrained manner.

During use of the gimbal assembly 1200, the wiring 504 is displaced within the housing 1300 via engagement with the retainer 1100, as discussed above in connection with the gimbal assembly 800, and the FPC 502 coils and uncoils about the clip 1302. More specifically, rotation of the housing 1300 in one direction, for example, clockwise, will result in coiling of the FPC 502 about the clip 1302, and rotation of the housing 1300 in the opposite direction, for example, counterclockwise, will result in uncoiling of the FPC 502 (or loosening of the coil). Incorporation of the clip 1302 thus allows for a reduction in the length of the wiring 504 by eliminating coiling thereof, and an increase in the length of the FPC 502 facilitated by coiling about the clip 1302.

The combined routing facilitated by the gimbal assembly 1200 may provide advantages in certain applications. For example, by eliminating coiling in the wiring 504, and thereby reducing the length of the wiring 504, the integrity of the signal carried by the wiring 504 may be increased. Conversely, the increased length of the FPC 502 facilitated by coiling about the clip 1302 may allow for improvements not only in power distribution, but in transmission of digital data and/or control signals to the gimbal assembly 1200.

Figure 12:
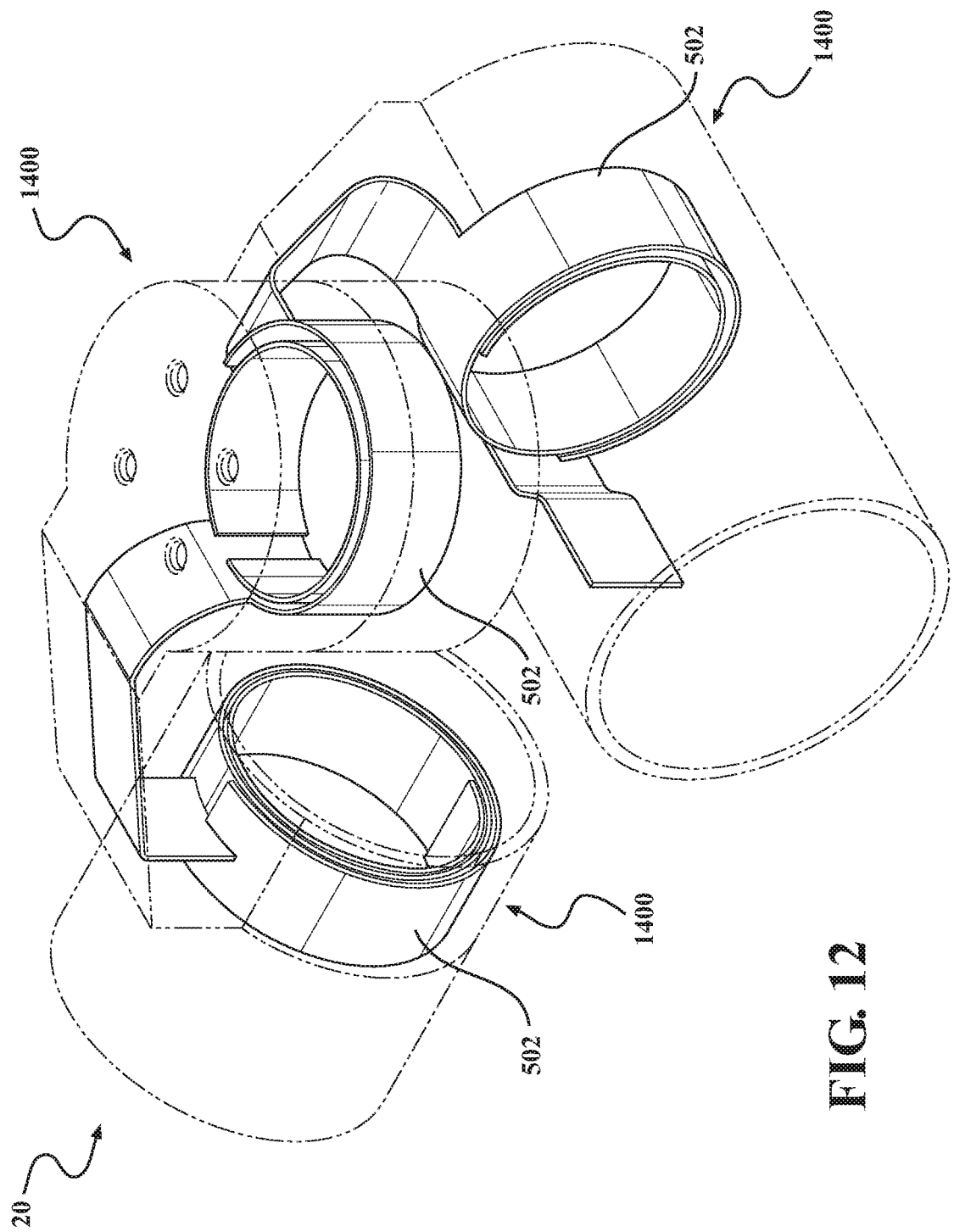
FIG. 12 is a perspective view of another embodiment of the gimbal system seen in FIG. 1 including a plurality of individual gimbal assemblies configured and dimensioned to route transmission media internally in a coiled configuration.

With reference now to FIG. 12, a variation on the gimbal system 10 seen in FIG. 1 (identified by the reference character 20) will be discussed. The gimbal system 20 includes three identical gimbal assemblies 1400, each of which includes a coiled FPC 502. By incorporating coiled FPCs 502 into the gimbal assemblies 1400, improvements in the transmission of high speed and low speed signals, such as video transmissions, power signals, and control signals for the gimbal assemblies 1400, may be realized.

To maintain the coiled configuration of the FPCs 502, it is envisioned that each of the gimbal assemblies 1400 may include a hub (not shown) or other such structure to support the coiled configuration of the FPCs 502. For example, in certain embodiments, it is envisioned that the one or more of the gimbal assemblies 1400 may include the clip 1302 (FIGS. 10, 11) discussed above with respect to the gimbal assembly 1200.

Persons skilled in the art will understand that the various embodiments of the disclosure described herein, and shown in the accompanying figures, constitute non-limiting examples, and that additional components and features may be added to any of the embodiments discussed hereinabove without departing from the scope of the present disclosure. Additionally, persons skilled in the art will understand that the elements and features shown or described in connection with one embodiment may be combined with those of another embodiment without departing from the scope of the present disclosure, and will appreciate further features and advantages of the presently disclosed subject matter based on the description provided. Variations, combinations, and/or modifications to any of the embodiments and/or features of the embodiments described herein within the abilities of a person having ordinary skill in the art are also within the scope of the disclosure, as are alternative embodiments that may result from combining, integrating, and/or omitting features from any of the disclosed embodiments.

Use of the term "optionally" with respect to any element of a claim means that the element may be included or omitted, both alternatives being within the scope of the claim. Additionally, use of broader terms such as "comprises," "includes," and "having" should be understood to provide support for narrower terms such as "consisting of," "consisting essentially of," and "comprised substantially of" Accordingly, the scope of protection is not limited by the description set out above, but is defined by the claims that follow, and includes all equivalents of the subject matter of the claims.

In the preceding description, reference may be made to the spatial relationship between the various structures illustrated in the accompanying drawings, and to the spatial orientation of the structures. However, as will be recognized by those skilled in the art after a complete reading of this disclosure, the structures described herein may be positioned and oriented in any manner suitable for their intended purpose. Thus, the use of terms such as "above," "below," "upper," "lower," "inner," "outer," "upward," "downward," "inward," "outward," etc., should be understood to describe a relative relationship between structures and/or a spatial orientation of the structures. Those skilled in the art will also recognize that the use of such terms may be provided in the context of the illustrations provided by the corresponding figure(s).

Additionally, terms such as "approximately," "generally," "substantially," and the like should be understood to allow for variations in any numerical range or concept with which they are associated. For example, it is intended that the use of terms such as "approximately" and "generally" should be understood to encompass variations on the order of 25%, or to allow for manufacturing tolerances and/or deviations in design.

Each and every claim is incorporated as further disclosure into the specification, and represents embodiments of the present disclosure. Also, the phrases "at least one of A, B, and C" and "A and/or B and/or C" should each be interpreted to include only A, only B, only C, or any combination of A, B, and C.

What is claimed is:

1. An image capturing system, comprising:
   a digital image capturing device (DICD); and
   a hand-held apparatus configured to support the DICD, the hand-held apparatus including:
      a grip;
      a gimbal system positioned adjacent to an upper end of the grip, the gimbal system including:
         a retainer; and
         a first gimbal assembly including:
            a first housing assembly, the retainer positioned adjacent to a sidewall of the first housing assembly; and
            a first motor assembly accommodated within the first housing assembly;
         a first arm connected to the gimbal system and including opposite first and second end portions; and
         a transmission media received by the retainer and extending through the first motor assembly of the first gimbal assembly to transmit data and/or power through the hand-held apparatus, the retainer configured to regulate positioning of the transmission media in relation to the first housing assembly.

2. The image capturing system of claim 1, wherein the transmission media includes a coaxial cable and/or a flexible printed circuit.

3. The image capturing system of claim 1, wherein the first arm defines an internal channel configured to receive the transmission media such that the transmission media extends through the gimbal system, into and through the internal channel in the first arm, to the DICD.

4. The image capturing system of claim 3, wherein the first motor assembly includes a first hollow motor shaft defining a first internal passage configured to receive the transmission media.

5. The image capturing system of claim 4, further including:
　a second gimbal assembly, including:
　　a second housing assembly; and
　　a second motor assembly accommodated within the second housing assembly;
　a second arm including opposite first and second end portions, wherein media extends from the first arm, into the second arm, and to the DICD; and
　a third gimbal assembly, wherein:
　　the first gimbal assembly is positioned adjacent to the second end portion of the second arm such that the first gimbal assembly is operatively connected to the DICD;
　　the second gimbal assembly is positioned adjacent to the first end portion of the second arm and the second end portion of the first arm; and
　　the third gimbal assembly is positioned adjacent to the first end portion of the first arm.

6. The image capturing system of claim 5, wherein the second motor assembly includes a second hollow motor shaft defining a second internal passage configured to receive the transmission media, and the third gimbal assembly includes a third hollow motor shaft defining a third internal passage configured to receive the transmission media.

7. The image capturing system of claim 6, wherein:
　the first gimbal assembly defines a first axis of rotation extending in generally orthogonal relation to the grip;
　the second gimbal assembly defines a second axis of rotation extending in generally orthogonal relation to the first axis of rotation; and
　the third gimbal assembly defines a third axis of rotation extending in generally orthogonal relation to the first and second axes of rotation.

8. The image capturing system of claim 7, wherein the second end portion of the second arm includes a forked support structure configured to support the DICD and the first gimbal assembly.

9. The image capturing system of claim 8, wherein the second gimbal assembly is configured and positioned to rotate the forked support structure and the DICD.

10. A hand-held apparatus configured to support a digital image capturing device (DICD), the hand-held apparatus including:
　a grip including opposite first and second ends; and
　a gimbal system configured to support stable movement of the DICD, the gimbal system including:
　　a first gimbal assembly positioned adjacent to the second end of the grip, the first gimbal assembly being configured for rotation about a first axis and including a motor assembly defining a channel configured to receive a coaxial cable such that the coaxial cable extends through the motor assembly of the first gimbal assembly and such that the first gimbal assembly is rotatable relative to the coaxial cable during actuation;
　　a first arm having opposite first and second end portions, the first gimbal assembly being positioned adjacent to the first end portion of the first arm;
　　a second gimbal assembly positioned adjacent to the second end portion of the first arm, the second gimbal assembly including a motor assembly and being configured for rotation about a second axis;
　　a second arm having opposite first and second end portions, the second gimbal assembly being positioned adjacent to the first end portion of the second arm;
　　a third gimbal assembly positioned adjacent to the second end portion of the second arm such that the third gimbal assembly is operatively connectable to the DICD, the third gimbal assembly including a motor assembly and being configured for rotation about a third axis; and
　　a retainer configured to receive the coaxial cable so as to regulate positioning of the coaxial cable during reconfiguration of the gimbal system, the retainer spaced radially outward of the motor assembly of the third gimbal assembly.

11. The hand-held apparatus of claim 10, wherein the first gimbal assembly is configured such that the first axis extends through the channel.

12. The hand-held apparatus of claim 11, wherein the first gimbal assembly includes a hollow motor shaft, the channel being defined by the hollow motor shaft of the first gimbal assembly.

13. The hand-held apparatus of claim 12, wherein the second gimbal assembly includes a hollow motor shaft and the third gimbal assembly includes a solid motor shaft.

14. The hand-held apparatus of claim 13, wherein:
　the first axis extends in generally parallel relation to the grip;
　the second axis extends in generally orthogonal relation to the first axis; and
　the third axis extends in generally orthogonal relation to the first and second axes.

15. The hand-held apparatus of claim 14, wherein the second end portion of the second arm includes a forked support structure configured to support the DICD and the third gimbal assembly such that the forked support structure and the DICD are rotatable by the second gimbal assembly.

16. A gimbal system for use with a digital image capturing device (DICD), the gimbal system comprising:
　a first gimbal assembly including:
　　a first housing assembly with first and second housings configured for relative rotation; and
　　a hollow motor shaft configured to accommodate a coaxial cable such that the coaxial cable extends through the first gimbal assembly, wherein at least one of the first and second housings of the first gimbal assembly is rotatable in relation to the coaxial cable;
　a second gimbal assembly including a second housing assembly with first and second housings configured for relative rotation;
　a first support extending between the first and second gimbal assemblies, the first support defining an internal channel configured to accommodate the coaxial cable;
　a third gimbal assembly configured for operative connection to the DICD, the third gimbal assembly including:
　　a third housing assembly with first and second housings configured for relative rotation; and
　　a hollow motor shaft configured to accommodate the coaxial cable such that the coaxial cable extends through the third gimbal assembly, wherein at least one of the first and second housings of the third gimbal assembly is rotatable in relation to the coaxial cable;

a second support extending between the second and third gimbal assemblies; and a retainer positioned adjacent to a side wall of the third housing assembly and configured to receive the coaxial cable so as to regulate positioning of the coaxial cable during reconfiguration of the gimbal system.

17. The gimbal system of claim 16, wherein the second support includes a forked support structure configured to support the third gimbal assembly and the DICD.

18. The gimbal system of claim 17, wherein the second gimbal assembly is configured and positioned to rotate the forked support structure and the DICD.

19. The gimbal system of claim 18, wherein the second gimbal assembly includes a hollow motor shaft configured to accommodate the coaxial cable such that the coaxial cable extends through the second gimbal assembly.

20. The gimbal system of claim 19, wherein:

the first gimbal assembly defines a first axis of rotation extending through the hollow motor shaft of the first gimbal assembly;

the second gimbal assembly defines a second axis of rotation extending through the hollow motor shaft of the second gimbal assembly; and the third gimbal assembly defines a third axis of rotation extending through the hollow motor shaft of the third gimbal assembly, the second axis of rotation extending in generally orthogonal relation to the first axis of rotation, and the third axis of rotation extending in generally orthogonal relation to the first and second axes of rotation.

\* \* \* \* \*